United States Patent [19]

Keck et al.

[11] Patent Number: 5,418,870
[45] Date of Patent: May 23, 1995

[54] COAXIAL COUPLER WITH INTEGRATED SOURCE/RING DETECTOR

[75] Inventors: Donald B. Keck, Big Flats; Daniel A. Nolan; David L. Weidman, both of Corning, all of N.Y.

[73] Assignee: Corning Incorporated, Corning, N.Y.

[21] Appl. No.: 234,065

[22] Filed: Apr. 28, 1994

[51] Int. Cl.[6] .............................................. G02B 6/28
[52] U.S. Cl. ...................... 385/31; 385/126; 385/127
[58] Field of Search ................ 385/31, 38, 126, 127

[56] References Cited

U.S. PATENT DOCUMENTS

| | | | |
|---|---|---|---|
| 4,279,465 | 7/1981 | Vojvodich | 385/88 |
| 4,314,740 | 2/1982 | Bickel | 385/47 |
| 4,363,533 | 12/1982 | Stowe et al. | 385/127 |
| 4,436,368 | 3/1984 | Keck | 385/127 |
| 4,709,413 | 11/1987 | Forrest et al. | 359/152 |
| 4,784,466 | 11/1988 | Khoe et al. | 385/33 |
| 5,096,277 | 3/1992 | Kleinerman | 385/12 |
| 5,177,803 | 1/1993 | Newhouse et al. | 385/43 |

FOREIGN PATENT DOCUMENTS 2179171A  2/1987  United Kingdom ..... G02B 6/26

OTHER PUBLICATIONS

C. H. Henry et al., Journal of Lightwave Technology, vol. 7, No. 10, Oct. 1989, "Glass Waveguides on Silicon for Hybrid Optical Packaging", pp. 1530–1539.
L. O. Svaasand et al., Proceedings of the 4th European Conference on Optical Communication (ECOC), Italy, 1978 (no month available), "Splicing of Optical Fibers with a Selective Etching Technique", pp. 304–308.
M. Kawachi et al., Electronic Letters, vol. 18, No. 2, 21 Jan. 1982, "Microlens Formation on VAD Single-Mode Fibre Ends", pp. 71–72.
J. R. Cozens et al. "Coaxial Optical Coupler", Electronics Letters, 4 Feb. 82, vol. 18, No. 3, pp. 138–140.
A. C. Boucouvalas et al. "Biconical Taper Coaxial Optical Fiber Coupler", Electronics Letters, 12 Sep. 85, vol. 21, No. 19, pp. 864–865.

Primary Examiner—Frank Gonzalez
Attorney, Agent, or Firm—W. J. Simmons, Jr.

[57] ABSTRACT

The invention features an optical two-way transmission-receiver communications system utilizing a coaxial coupler having a ring waveguide and a core waveguide. A surface of an integrated source/ring detector substrate is positioned adjacent said coaxial coupler endface. A ring detector on the substrate, which receives light transmissions from the ring waveguide, has an annular opening therein. A light source disposed on the substrate within the annular opening in the ring detector directs light transmissions to the core waveguide of the coaxial coupler. An alignment device positions the substrate with respect to the coaxial coupler so that the light source and detector are respectively aligned with the coaxial coupler core and ring waveguides.

19 Claims, 3 Drawing Sheets

COAXIAL COUPLER WITH INTEGRATED SOURCE/RING DETECTOR

BACKGROUND OF THE INVENTION

The present invention relates to two-way optical communication systems, and more particularly to a transmitter-receiver apparatus comprising coaxial couplers.

A key component of two-way optical transmission systems is the transmitter-receiver (Tx/Rx) package. Such packages were originally fabricated with 1×2 or 2×2 couplers in combination with standard transmitters, such as laser diodes or in some applications, light emitting diodes, and standard receivers, such as PIN diodes. Such a system is disclosed in the publication, C. H. Henry et al, "Glass Waveguides on Silicon for Hybrid Optical Packaging", Journal of Lightwave Technology, vol. 7, No. 10, October, 1989, pp. 1530–1539.

U.S. Pat. No. 5,177,803 discloses a transmitter-receiver apparatus in which the standard coupler is replaced by a coaxial coupler. The coaxial coupler is a cylindrically-shaped device having a ring waveguide that is radially spaced from a central core waveguide. The longitudinally central region of the device is necked down to provide the desired type of coupling between the ring and core waveguides. At one end of the device the core waveguide is connected a transmission optical fiber. At the other end, an annular light detector is situated immediately adjacent the ring waveguide, and light is coupled from a source to the core waveguide through an aperture in the light detector. The light source and detector must be separately aligned with the core and ring waveguides, respectively.

SUMMARY OF THE INVENTION

It is an object of the invention to provide an improved Tx/Rx package utilizing a coaxial coupler. Another object is to provide a Tx/Rx package in which the light source and light detector are simultaneously aligned to a coaxial coupler.

The subject invention utilizes the integration of source and detector on a single chip or substrate to enable the fabrication of a more compact and more easily manufactured Tx/Rx package.

The present invention relates to an input/output device for a two-way optical communications system. The input/output device utilizes a coaxial coupler for coupling light from a transmission fiber to a detector and coupling a light source to the transmission fiber. The optical system can operate either in a single or multiple wavelength mode by proper design of the coupling region (i.e., either in 3 dB or WDM operation).

In accordance with the present invention, the input/output device comprises a coaxial coupler having a core waveguide surrounded by a ring waveguide, the coupler having an endface at which the core and ring waveguides terminate. The first surface of a substrate is positioned adjacent the coaxial coupler endface. A light emitter and a light detector are located at the first surface of the substrate. The phrase "at the first surface" means that the device can be located on the surface of, in the surface, or in a depression in the surface. One of the light emitter and light detector is optically connected to the ring waveguide, and the remaining one of the light emitter and light detector is optically connected to the core waveguide of the coaxial coupler.

The input/output device preferably further comprises alignment fixtures on the coupler endface in engagement with alignment fixtures on the substrate surface for positioning the substrate with respect to the coupler.

DESCRIPTION OF THE PREFERRED EMBODIMENT

Figure 1:
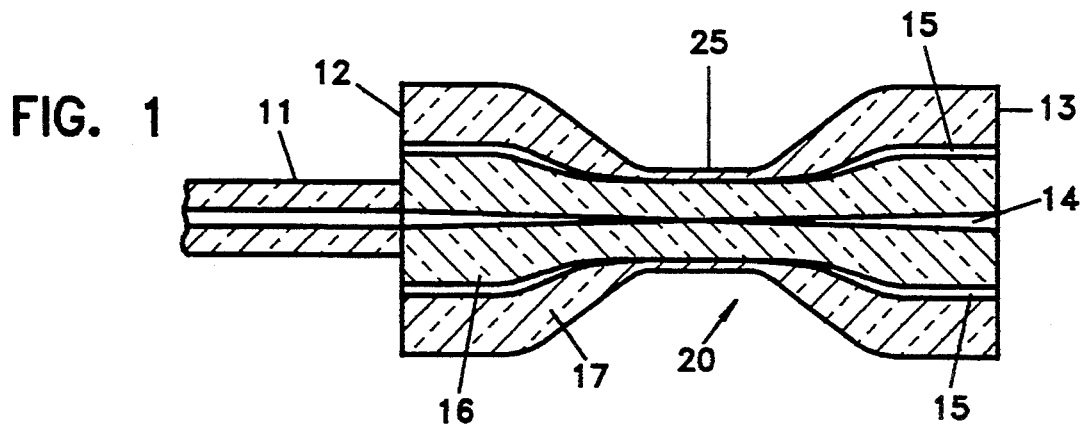
FIG. 1 is a cross-sectional view of a coaxial coupler.

FIG. 1 shows a coaxial coupler 20 of the type disclosed in U.S. Pat. No. 5,177,803. Coupler 20 comprises a central core waveguide 14 surrounded by a ring waveguide 15. Matrix glass region 16, which is disposed between waveguides 14 and 15, and matrix glass region 17, which is disposed about waveguide 15, have a refractive index lower than that of waveguides 14 and 15. The composition of matrix glass 17 can be the same as matrix glass 17, or those glasses can be different. In the embodiment illustrated in FIG. 1, a transmission optical fiber 11 is butted against endface 12 in alignment with core waveguide 14. Depending on the method of making the coupler, an optical fiber pigtail extending from endface 12 could couple core waveguide 14 with the transmission fiber. Coaxial coupler 20 is tapered inwardly at midregion 25 to achieve the desired coupling between core waveguide 14 and ring waveguide 15. Coupler 20 can combine light signals that are spatially separated, and it can separate or split light signals that are spatially combined. Thus, for example, coupler 20 can be a WDM coupler, the operation of which is such that all incoming light at a wavelength of 1310 nm from transmission optical fiber 11 is coupled from the core waveguide 14 to the ring waveguide 15. Also, 1550 nm wavelength light that is introduced into core waveguide 14 at endface 13 exits the coupler in core waveguide 14. Alternatively, the coupler could function as a signal splitter whereby some fraction, e.g. 50% of the incoming light at a given wavelength couples from core 14 to ring waveguide 15. Other splitting ratios are possible.

Two different mechanisms which may be used to provide the coupling required in a coaxial coupler are described in U.S. Pat. No. 5,177,803 which is incorporated herein by reference. One of these is referred to as "$\beta$-matching", and the other is nonadiabatic mode coupling.

A coaxial coupler preform may be formed by threading an optical fiber having an axial core through a glass overclad tube. The tube is formed such that it has a high refractive index ring core region either at its inner surface or between its inner and outer surfaces, the remainder being formed of lower refractive index glass. The original diameter of the tube is preferably about 2.2 to 3.0 millimeters, although other diameters are suitable. Any protective coating that may be on the fiber is removed from that portion that extends within the tube. The fiber extending from tube endface 12 would preferably have protective coating material (not shown). The midregion of the coupler preform is evacuated and heated to collapse it onto the fiber. The tube is further heated, and the ends thereof are pulled in opposite directions to increase the tube length and reduce its diameter. The central portion of the stretched midregion 25 constitutes a neckdown region where the core and ring waveguides are sufficiently closely spaced for a sufficient distance to effect the desired coupling therebetween. The extension of the fiber 14 past the end of the tube can then be used as a pigtail for attachment to the transmission line. The pigtail can be broken off flush with endface 13 of the tube, and that endface can be ground and polished flat. Also, in accordance with U.S. Pat. No. 5,177,803, the fiber can have a lens fabricated on its end (before or after insertion into the tube) for better coupling to a laser diode. Such a lensed fiber would extend beyond endface 13.

The coupler can also be manufactured by inserting a specially designed fiber having core and ring waveguides into a tube that contains no waveguide region, i.e. a tube having a uniform composition and refractive index. The tube is collapsed onto the fiber and stretched as described above.

A coaxial coupler can also be al formed in accordance with the teachings of U.S. Pat. Nos. 4,704,151 and 4,799,949. A coupler preform is formed by a technique such as inserting a fiber preform into a tube having a high refractive index ring or by depositing glass onto a fiber preform to form thereon a high index layer and a cladding layer. A fiber preform is a cylindrical preform having an axial glass core region surrounded by cladding glass; if merely heated and drawn it would become an optical fiber. The coupler preform is drawn into a rod of the desired diameter. The rod is severed into pieces, each of which is stretched at its midregion to form a coaxial coupler.

In general, coaxial coupler configurations have certain advantages for Tx/Rx applications. Clearly, the two light conduits, core waveguide 14 and ring waveguide 15, are adequately separated at one end of the structure (e.g., at endface 13) while waveguides 14 and 15 are closely spaced at the tapered region where coupling occurs. Moreover, a coaxial coupler is easily connectable to a transmission fiber by various techniques described herein.

In the Tx/Rx system of U.S. Pat. No. 5,177,803, an annular light detector is positioned adjacent endface 13 of coupler 20, a hole in the detector being centered about core waveguide 14. The detector receives light from the two-way communications system via the ring waveguide 15. Light from a source is coupled through an aperture in the annular detector and onto the end of core 14 at endface 13. The diameter of the ring waveguide is made sufficiently large to provide the necessary separation between the ring waveguide 15 and the core waveguide 14 so that coupling occurs only in region 25.

When such a Tx/Rx apparatus is assembled, the detector must be aligned with ring waveguide 15, and in a separate operation, the lens and detector must be aligned with core waveguide 14.

Figure 2:
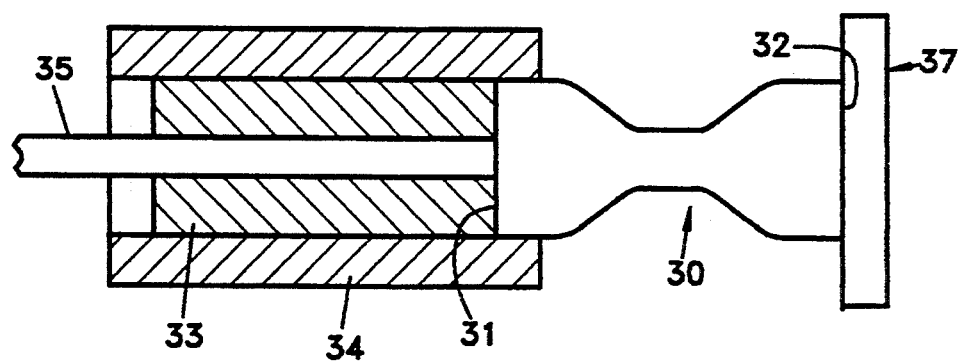
FIG. 2 is a schematic view of one embodiment of the invention.
Figure 3:
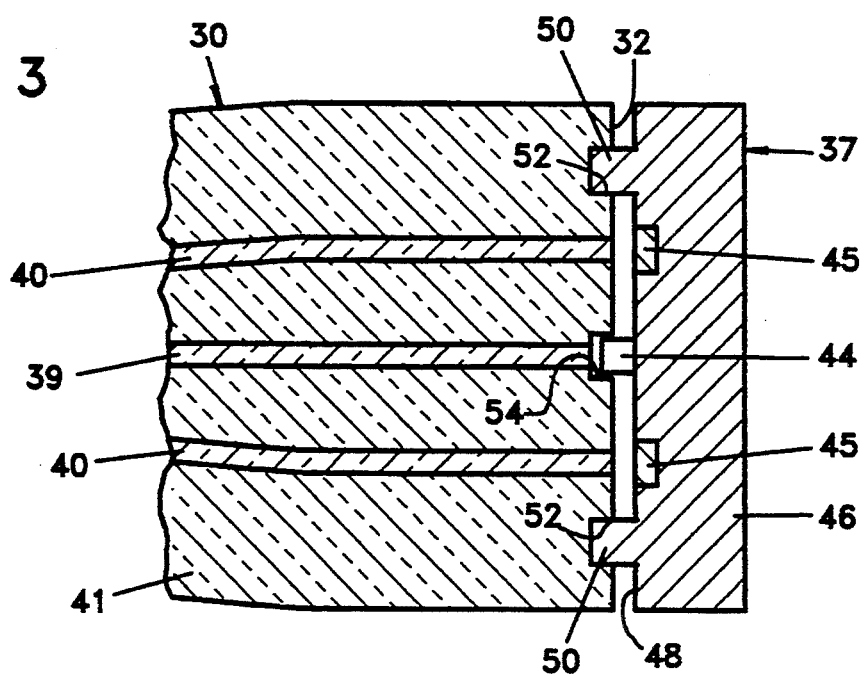
FIG. 3 is a cross-sectional view showing the alignment of an integrated source/ring detector with a coaxial coupler.

The present invention features apparatus for improving the above described two-way optical communication system. The materials and components utilized in the invention are those used in standard two-way communication systems, unless indicated to contrary. As shown in FIGS. 2 and 3, the apparatus of the invention utilizes a coaxial coupler 30 in conjunction with the combination of an integrated source and ring detector 37 to provide a new Tx/Rx system. The core of transmission fiber 35 is butted against endface 31 in alignment with central core waveguide 39. To facilitate alignment of fiber 35 to coupler 30 in the field, fiber 35 is inserted into the bore of a ferrule 33 which is then placed into alignment sleeve 34 which also surrounds at least one end of coupler 30.

Alternatively, fiber 35 could be a fiber pigtail integrally formed with the coupler, the pigtail end being fused to a transmission fiber.

The invention modifies the detector and light emitter by combining them on a single substrate in precise relationship with one another, whereby alignment of the substrate with the end of the coaxial coupler simultaneously results in the alignment of the detector with the ring waveguide of the coaxial coupler and the alignment of the light emitter with the axial core waveguide of the coaxial coupler. In this manner, the detector is coupled to the light being transmitted through the system via the ring waveguide, and the light emitter is coupled to the core waveguide for light transmission.

As shown in FIG. 3, coupler 30 is operatively associated with an integrated source/ring detector 37 which comprises a substrate 46 having a light emitter 44 and a ring detector 45 thereon. In one embodiment a ring detector could be formed on or in a semiconductor substrate, and a light emitting device could be affixed to the region of the substrate within the ring detector. In another embodiment many source and detector pairs could be fabricated on one chip using semiconductor processing technology, and the chip could be sliced into individual source/ring detector units, each of which would be mated with a coaxial coupler. In either embodiment the light emitter is preferably precisely centered within the ring detector. It is noted that the positioning of the light emitter with respect to its waveguide path is usually more critical than the positioning of the light detector with respect to its waveguide path. The light sensing area of the detector can be somewhat larger than the light emitting area of the light source. Therefore, if the light emitter is precisely aligned with its waveguide path, the detector is adequately aligned with its waveguide path. However, as indicated below, it is desirable to maintain the area of the light detector as small as possible to reduce its capacitance.

In the regions of the coupler other than the neckdown (coupling) region, the separation between ring waveguide 40 and core waveguide 39 should be at least 5–10 wavelengths (about 5–15 $\mu$m) to prevent optical coupling; however, much larger separations are possible. This separation dictates the minimum inner radius of annular light detector 45 which is equal to or less than the inner radius of ring waveguide 40. The inner radius and thickness and thus the cross-sectional area of detector 45 should not be so large that the resultant capacitance limits its speed of operation. The detector can be in the form of a continuous annular ring, or it can be formed of an annular arrangement of discrete units to improve its high bit rate performance.

Light source 44 can be a surface emitting laser such as that disclosed in the publication, J. W. Scott et al. "Optimization of Vertical Cavity Surface Emitting Lasers: Limitations of Output Power", [IEEE/Lasers and Electro-Optics Society] 1991, San Jose, Calif., Paper No. SDL4.4, Nov. 4–7, 1991. Alternatively, source 44 could be an edge-emitting diode having Bragg gratings for directing the radiation toward core 39. Such light emitters do not require lensing for efficient coupling to core 39 in view of the close proximity of the light emitting device to core 39. For example, endface 32 might be less than 20 μm from chip surface 48.

The ring detector could be fabricated using the indium-gallium-arsenide technology disclosed in U.S. Pat. No. 4,709,413, for example.

To facilitate the proper mating of the components of the integrated source and ring detector 37 with the core and ring waveguides of coupler 30, alignment fixtures can be formed on the mating surfaces. For example, surface 48 (see FIG. 3) of semiconductor substrate 46 can be etched to form protrusions 50. Similarly, endface 32 of coupler 30 can be etched to form wells 52. The etching process can be performed using photolithographic techniques whereby the respective surface is etched through openings in a mask to form precisely positioned alignment fixtures. Devices 30 and 37 can be quickly and precisely aligned by positioning protrusions 50 into wells 52.

A consideration in the design of the apparatus of FIGS. 2 and 3 is the near-end optical crosstalk, which is the amount of the optical signal emitted by source 44 that is detected by the detector 45. Near-end optical cross-talk can be reduced by recessing core 39 and the adjacent part of the coupler matrix glass 41 at endface 32 to reduce the amount of transmitted light that reflects or scatters from coupler endface 32 to detector 45. Again, a mask having an opening over the region to be etched is formed by photolithographic techniques. During this process, the photoresist can be exposed by propagating light in core 39 and the adjacent portion of matrix glass toward endface 32. After the mask is formed, the fiber core and immediately surrounding matrix glass can be removed by etching to form a well 54.

A well corresponding to well 54 could also be formed by making use of the differential etch rates of different glasses in coupler 30. For example, if the light source is smaller than the diameter of core 39, then core 39 can be formed of a glass that etches more readily than matrix glass 41. For example, core 39 could be formed of silica doped with $GeO_2$ and $B_2O_3$ in amounts sufficient to provide the required refractive index and also provide the desired etch rate in a given solvent, e.g. an acid.

Figure 4:
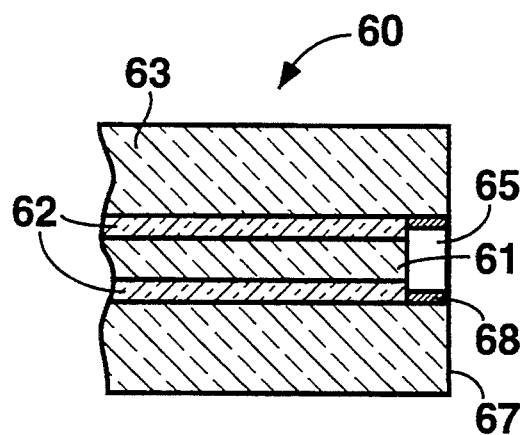
FIG. 4 is a cross-sectional view of an optical fiber having an etched well.

The fiber employed in the fabrication of the coaxial coupler can be formed as illustrated in FIG. 4 to make a well larger than the core diameter. Fiber 60 comprises a core 61 and claddings 62 and 63. The core can be formed of silica doped with $GeO_2$ and $B_2O_3$ in amounts sufficient to provide the required refractive index and also provide the desired etch rate in HF, for example. Outer cladding 63 can be formed of silica, which exhibits a refractive index lower than that of core 61 and is resistant to etching in HF. Inner cladding region 62 can be formed of silica doped with $GeO_2$ and $B_2O_3$ in amounts sufficient to provide a refractive index substantially matching that of silica and also provide the desired etch rate in HF. When endface 67 is subjected to HF, well 65 is etched therein.

To further reduce the amount of scattered light reaching the detector, the sides of well 54 could be provided with a coating 68 with a light reflecting material such as aluminum or a light absorbing material as shown in FIG. 4.

Figure 5:
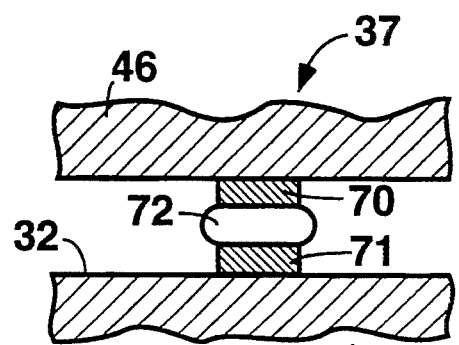
FIG. 5 is a cross-sectional view illustrating the alignment of two surfaces.

A soldering technique illustrated in FIG. 5 could also be employed for aligning chip 37 to coaxial coupler endface 32. Those locations on endface 32 that are provided in FIG. 3 with wells would be provided with metallizations 71. Those locations on the surface of substrate 46 that are provided in FIG. 3 with protrusions would be provided with metallizations 70. After solder 72 has been applied to metallizations 70, chip 37 is positioned adjacent to endface 32 so that the solder contacts metallizations 71. The surface tension of the molten solder brings chip 37 into alignment with endface 32. For further discussion of this type of soldering technique, see *Electronic Packaging Forum*, Volume 1, edited by J. E. Morris, Van Nostrand Reinhold, New York, N.Y., 1990, pp. 34–40.

Figure 6:
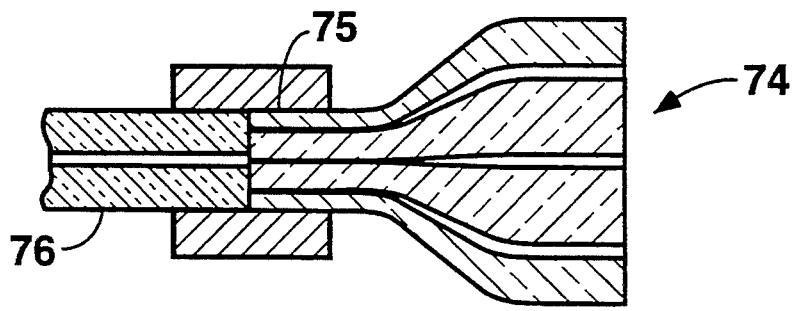
FIG. 6 is a cross-sectional view illustrating a coaxial coupler that terminates at its neckdown region.

As shown in FIG. 6 coupler 74 could be severed in its neckdown region, thereby eliminating the large diameter portion including endface 31 of FIG. 2. The neckeddown region 75 is made sufficiently long that the desired coupling occurs therein. Such a coupler is designed so that the mode field diameter of the core waveguide plus the ring waveguide in the small diameter end of coupler 74 approximately matches the mode field diameter of the core of transmission fiber 76. The transmission fiber can therefore be connected directly to the severed neckdown region of the coupler. A ferrule 77 could be employed to align fiber 76 to coupler 74. The large diameter end of coupler 74 mates to the light source/ring detector as described in conjunction with FIG. 3.

Figure 7:
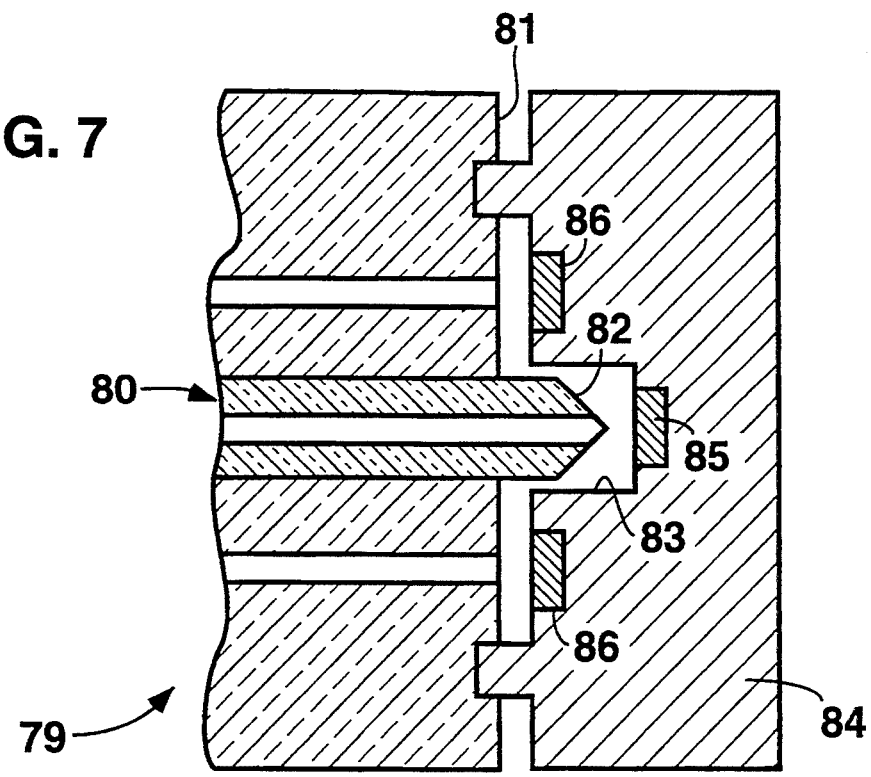
FIG. 7 is a cross-sectional view of a system in which transmitter-to-receiver cross-talk is reduced.

Referring to FIG. 7, coupler 79 is formed such that optical fiber 80 extends from endface 81. A lens 82 is formed on the end of fiber 80. Although various kinds of lens-shaped fiber ends could be employed, a conical lens is shown. The lensed end of fiber 80 extends into a well 83 formed in the surface of substrate 84. Light emitting device 85 is formed in substrate 84 at the bottom of well 83. The remaining construction of the system of FIG. 7 is similar to that of FIG. 3. Light from source 85 is coupled to the core of fiber 80. Reflected light from the lensed end 82 propagates behind detector 86 which therefore cannot detect such reflected light.

Referring again to FIG. 3, light emitted by source 44 could be directed into core waveguide 39 by forming lensing regions on endface 32 in alignment with core waveguide 39 by etching techniques such as those disclosed in the publications, L. O. Svaasand et al, "Splicing of Optical Fibers with a Selective Etching Technique", Proceedings of the [4th European Conference on Optical Communication (ECOC), Genoa, [Italy], 1978, pp. 304–308, and M. Kawachi et al. "Microlens Formation on VAD Single-Mode Fibre Ends", Electronics Letters, 21st Jan., 1982, Vol. 18, No. 2, pp. 71–72. Ring waveguide 40 could also be lensed.

Figure 8:
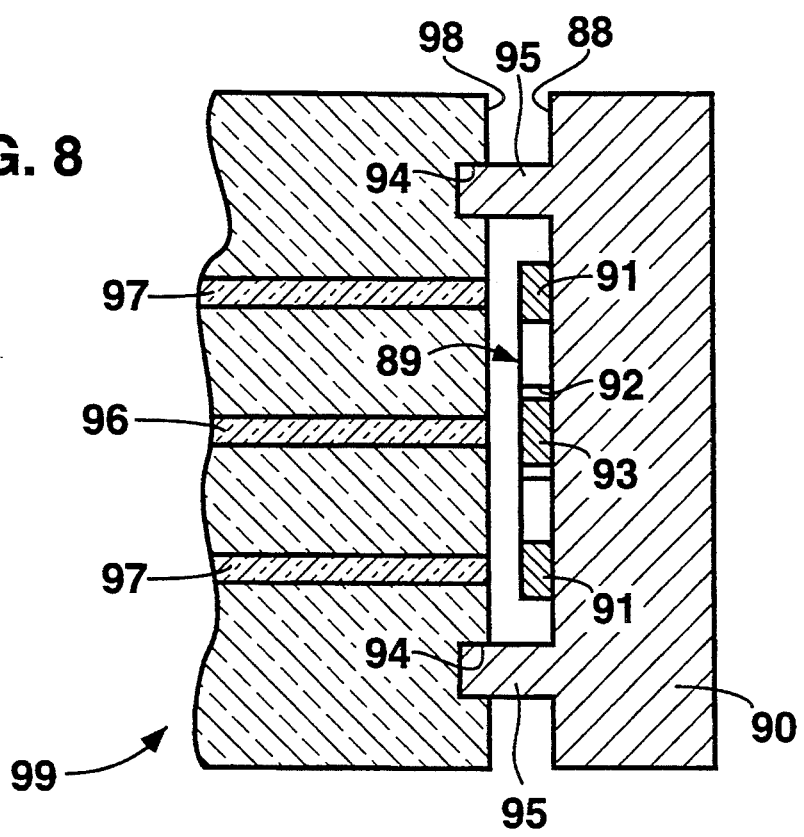
FIG. 8 is a cross-sectional view of a further embodiment of the invention.

Whereas in the previous embodiments the light source was aligned with the central core waveguide of the coaxial coupler, it could instead be aligned with the ring waveguide. As shown in FIG. 8 an annular light emitter 89 that is formed of a material such as gallium arsenide is formed on the surface of substrate 90. An annular light emitting region 91 is formed at the outer periphery of emitter 89. A well 92 can be formed in the center of emitter 89 to provide a region for supporting light detector 93. Alternatively, device 89 could be formed without well 92, and detector 93 could be formed on the surface of device 89. When substrate 90 is placed adjacent to endface 98 of coaxial coupler 99, and protrusions 95 are inserted into wells 94, annular light emitting region 91 is in optical communication with ring waveguide 97, and detector 93 is in optical communication with central core waveguide 96.

Either coupler endface 98 or substrate surface 88 could be provided with wells such as those illustrated in FIGS. 3 and 7, respectively.

Figure 9:
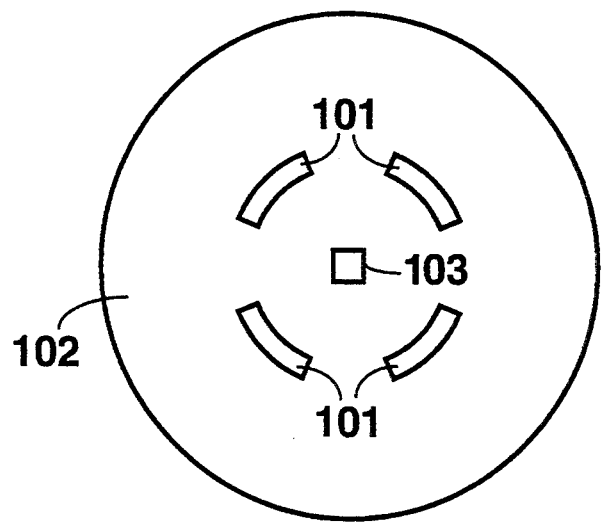
FIG. 9 schematically illustrates an annular arrangement of light emitters about a centrally located detector.

FIG. 9 shows that a plurality of light emitters 101 could be arranged on substrate 102 in an annular pattern such that they are in optical communication with the coaxial coupler ring waveguide. Detector 103 would be in optical communication with the central core waveguide of the coaxial coupler. Emitters 101 could all emit light having a given wavelength, or each of the emitters could emit light of a different wavelength.

In a similar manner, the emitter could be centrally located, as shown in FIG. 3, and the light detector could be formed in a plurality of segments which could detect a single wavelength or a plurality of different wavelengths.

What is claimed is:

1. An input/output device for a two-way optical communications system, comprising:
    a coaxial coupler having a core waveguide surrounded by a ring waveguide, said coupler having an endface at which said core and ring waveguides terminate and a coupling region spaced from said endface, the cross-sectional dimension of said coupling region being smaller than the cross-sectional dimension of said coupler at said endface,
    a substrate having a first surface positioned adjacent said coaxial coupler endface,
    a light emitter and a light detector located at said first surface of said substrate,
    one of said light emitter and light detector being optically connected to said ring waveguide, and
    the remaining one of said light emitter and light detector being optically connected to said core waveguide of said coaxial coupler.

2. An input/output device in accordance with claim 1 wherein said detector is defined by annular inner and outer boundaries and is located at said substrate in light receiving relationship with respect to said ring waveguide, and said light source is located at said substrate within said inner detector boundary for directing light transmissions to said core waveguide of said coaxial coupler.

3. An input/output device in accordance with claim 2 further comprising a depressed region in said coupler endface, said depressed region being centered on the longitudinal axis of said core waveguide, the diameter of said depressed region being at least as large as the diameter of said core waveguide, said light emitter extending into said depressed region.

4. An input/output device in accordance with claim 3 wherein the diameter of said depressed region is larger than the diameter of said core waveguide.

5. An input/output device in accordance with claim 2 wherein that end of said core waveguide at said coaxial coupler endface is formed into a lens.

6. An input/output device in accordance with claim 2 further comprising a well in said substrate, said emitter being disposed within said well, said core waveguide extending from said coupler endface into said well, that portion of said core that extends beyond said endface having cladding thereon.

7. An input/output device in accordance with claim 6 wherein said core waveguide has a lens on its end.

8. An input/output device in accordance with claim 2 wherein said detector is formed of a plurality of segments.

9. An input/output device in accordance with claim 1 wherein said light emitter is defined by annular inner and outer boundaries and is located at said substrate in light receiving relationship with respect to said ring waveguide, and said light detector is located at said substrate within said inner detector boundary for directing light transmissions to said core waveguide of said coaxial coupler.

10. An input/output device in accordance with claim 9 further comprising a depressed region in said coupler endface, said depressed region being centered on the longitudinal axis of said core waveguide, the diameter of said depressed region being at least as large as the diameter of said core waveguide, said light detector extending into said depressed region.

11. An input/output device in accordance with claim 10 wherein the diameter of said depressed region is larger than the diameter of said core waveguide.

12. An input/output device in accordance with claim 9 further comprising a well in said substrate, said detector being disposed within said well, said core waveguide extending from said coupler endface into said well, that portion of said core that extends beyond said endface having cladding thereon.

13. An input/output device in accordance with claim 12 wherein said core waveguide has a lens on its end.

14. An input/output device in accordance with claim 9 wherein said emitter is formed of a plurality of segments.

15. An input/output device in accordance with claim 14 wherein each of said plurality of emitter segments emits a different wavelength of light.

16. An input/output device in accordance with claim 1 further comprising alignment fixtures on said coupler endface in engagement with alignment fixtures on said substrate surface.

17. An input/output device in accordance with claim 16 wherein said alignment fixtures comprise wells in either of said coupler endface or said substrate surface, and protrusions on the other of said coupler endface and said substrate surface, each of said protrusions extending into a corresponding one of said wells.

18. An input/output device in accordance with claim 17 wherein said coupler alignment fixtures comprise wells in said coupler endface, and wherein said substrate alignment fixtures comprise protrusions on said substrate surface extending into corresponding ones of said wells.

19. An input/output device in accordance with claim 16 wherein said alignment fixtures comprise coupler metallizations on said endface and metallizations on said first surface in alignment with said coupler metallizations, and a mass of solder between each coupler medullization and the respective metallization on said first surface.

* * * * *